United States Patent [19]

Hall et al.

[11] Patent Number: 4,526,809

[45] Date of Patent: Jul. 2, 1985

[54] PROCESS AND APPARATUS FOR FORMATION OF PHOTOVOLTAIC COMPOUNDS

[75] Inventors: Robert B. Hall, Newark; Richard E. Rocheleau, Wilmington, both of Del.

[73] Assignee: University of Delaware, Newark, Del.

[21] Appl. No.: 543,548

[22] Filed: Oct. 19, 1983

[51] Int. Cl.³ ............................................. H01L 29/22
[52] U.S. Cl. ...................................... 427/74; 156/611; 156/DIG. 72; 156/DIG. 103; 427/85; 427/87
[58] Field of Search ............................. 427/74, 85, 87; 156/611, DIG. 103, DIG. 72

[56] References Cited

U.S. PATENT DOCUMENTS 3,531,335  9/1970  Heyerdahl et al. ................. 148/174
4,239,553 12/1980  Barnett et al. ...................... 136/256
4,267,398 12/1981  Rothwarf ............................ 136/256
4,325,986  4/1982  Baron et al. ........................ 427/74

OTHER PUBLICATIONS

Gambino et al., "Evaporation Source for the Co-Deposition of Materials with Different Vapor Pressures", IBM TDB 14, Jun. 1, 1971.

Anderson, et al., *Final Report SAN-1459-5* U.S. Department of Energy, EG-77-C-03-1459, Lockheed Corp., (1978), pp. 2-11.

Romeo, et al., *Applied Phys. Letters*, 32, (1978), p. 809.

Faurie, et al., *J. Crystal Growth* 54, (1981), p. 583.

Smith, et al., *J. Applied Phys.* 46, No. 6 (1975), p. 2369.

*Primary Examiner*—John D. Smith
*Attorney, Agent, or Firm*—John A. Parkins

[57] ABSTRACT

The invention relates to a process and apparatus for formation and deposition of thin films on a substrate, in a vacuum, by evaporation of the elements to form a $Zn_xCd_{1-x}S$ compound having a preselected fixed ratio of cadmium to zinc, characterized by the evaporation of cadmium and zinc at a rate the ratio of which is proportional to the stoichiometric ratio of those elements in the intended compound and evaporation of sulfur at a rate at least twice the combined rates of cadmium and zinc, and at least twice that required by the stoichiometry of the intended compound.

7 Claims, 6 Drawing Figures

PROCESS AND APPARATUS FOR FORMATION OF PHOTOVOLTAIC COMPOUNDS

The Government of the United States of America has certain rights to this invention pursuant to Subcontract No. XR-9-8309-1 awarded by the Solar Energy Research Institute under Contract No. EG-77-C-01-4042 awarded by the U.S. Department of Energy.

BACKGROUND OF THE INVENTION

The nature of photovoltaic cells, terminology employed and the general background of the present invention have been described in the background section of U.S. Pat. No. 4,239,553, relating to thin film photovoltaic cells wherein one of the present co-inventors is also a co-inventor in that patent, which is incorporated herein by reference.

That patent points out that thin film photovoltaic cells have many potential advantages. Of the four types of thin film cells which in the laboratory have demonstrated efficiencies greater that 10 percent, three are based on polycrystalline thin film semiconductors. One of the semiconductors in each of these polycrystalline cases is chosen from elements of groups II and VI of the periodic system of elements, in particular, cadmium sulfide (CdS) or zinc cadmium sulfide (ZnCd)S. The ternary compound, (ZnCd)S, with its additional component, provides additional opportunities for higher energy conversion efficiency without introducing expensive raw materials.

The utility of (ZnCd)S in photovoltaic conversion resides in this ability to engineer certain of its properties to optimize photovoltaic conversion efficiency. Specifically, these properties include optical band gap, electron affinity, majority carrier concentration and lattice constant. These properties are acutely sensitive to changes in the composition of (ZnCd)S.

The empirical formula $Zn_xCd_{1-x}S$, where x is a positive number less than one, is indicative of the variability of this composition. As might be expected of this three-component compound having a wide latitude in the content of the metal elements, difficulty could be experienced during production in achieving and maintaining the desired ratio of these elements upon which the properties are dependent. Primary consideration must be given in the choice of a process to its suitability for precise control and uniformity of the composition produced.

Several techniques are known in the art for formation of $Zn_xCd_{1-x}S$ thin films on substrates:

(a) Spray pyrolysis:
(b) Chemical vapor deposition;
(c) Sputtering, including reactive and compound targets;
(d) Co-evaporation of CdS and ZnS; and
(e) Elemental evaporation.

Further elaboration of the details of each method is unnecessary at present; it is important to observe, however, that the method selected for commercial use must meet certain requirements:

(a) it must provide an adherent coating precise and uniform in composition, crystallographic structure and thickness;
(b) it must be capable of operation at high production rates (high rates of deposition of thin film on substrate); and
(c) it must effectively utilize materials, particularly with little wastage of costly components.

In the elemental evaporation method the component elements of $Zn_xCd_{1-x}S$, (along with any dopant, as appropriate), are simultaneously evaporated from heated vessels in a vacuum and allowed to impinge on a surface of a substrate where they chemically combine to form the desired composition.

In spite of the extent to which technology has been directed to developing $Zn_xCd_{1-x}S$ semiconductor films for photovoltaic applications and the like, the prior art has not provided a solution to the problem of composition control, raw materials utilization and uniformity in the product in a process suitable for commercial use.

The present invention is addressed to the objects of providing a process of forming and depositing $Zn_xCd_{1-x}S$ coatings of precise composition with high, efficient utilization of metal.

SUMMARY OF THE INVENTION

The objects are realized by the present invention which includes a process for forming and precisely controlling the composition and deposition of a uniform thin coating of $Zn_xCd_{1-x}S$ semiconductor on a substrate by vacuum evaporation of the elements of the semiconductor, and an apparatus for carrying it out. The process is characterized by evaporation of sulfur at a rate at least twice the rate relative to the rate of evaporation of the other elements as required by stoichiometry of the intended semiconductor composition. Among the objects is the provislon of a process capable of controlling the majority carrier concentration, the band gap, and the electron affinity of the ternary compound, zinc cadmium sulfide. A further object of the invention is to provide a process making maximum usage of the more costly metal components of the composition. A still further object is to provide a process for incorporation of dopants for control and adjustment of the resistivity of the photovoltaic composition.

An apparatus adapted to carrying out this and other processes comprises a novel source for evaporation of the elements, which source has an evaporation chamber for each of the elements, including a dopant, if employed. Each of the separate chambers is heated by an independently controllable electric heating means. Further, each chamber is provided with an individual heated conduit to provide flow of vapor from the evaporation chamber to a confluence zone adjacent the substrate upon which the vapor streams impinge and chemically combine to form the semiconductor compositions. The substrate at a coating station, is positioned apart from the source and immediately adjacent a heater which radiantly heats the substrate. The coating apparatus is in a vacuum enclosure which houses the substrate, the coating station and, preferably, the source.

THE DRAWINGS

The problems solved and the method and apparatus providing a solution will be more fully understood by reference to the drawing wherein:

FIG. 1 illustrates the relationship of band gap of $Zn_xCd_{1-x}S$ to the ratio of cadmium to zinc in the composition;

FIG. 2 graphically illustrates the growth of CdS and ZnS as a function of the sulfur vapor flux;

DETAILED DESCRIPTION

The Process

Figure 1:
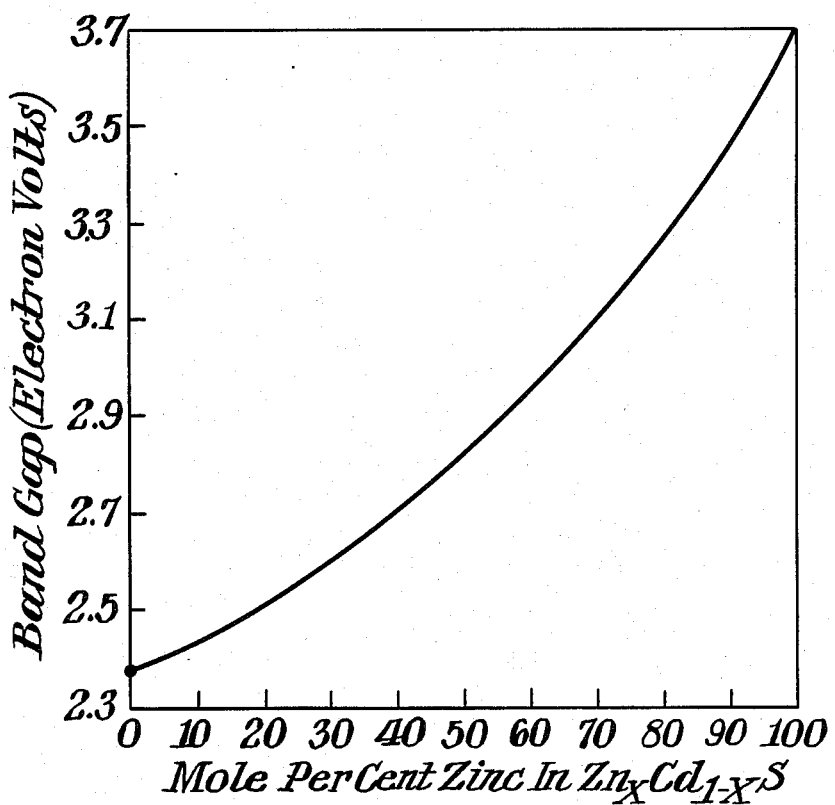

The utility in photovoltaic conversion requires that the band gap of the semiconductor composition be consistent with other properties such as electron affinity. In the ternary compound, $Zn_xCd_{1-x}S$, there is a significant dependence of band gap and electron affinity of the semiconductor on the ratio of zinc to cadmium. FIG. 1 illustrates the dependence of band gap on zinc content in $Zn_xCd_{1-x}S$ semiconductor.

Similar variations in electron affinity with composition are known, the desired composition depends on the photovoltaic device in which $Zn_xCd_{1-x}S$ is used. For example, when the desired heterojunction comprises $Cu_2S$ and $Zn_xCd_{1-x}S$, it is believed that optimum conversion efficiency is attained where x=0.4 or less. Heterojunctions comprising $CuInSe_2$ and $Zn_xCd_{1-x}S$ are believed to attain optimum efficiency when x=0.10 to 0.20. Heterojunctions comprising $Zn_xCd_{1-x}S$ and CdTe are believed to attain optimum conversion efficiency when x is up to 0.4.

Figure 2:
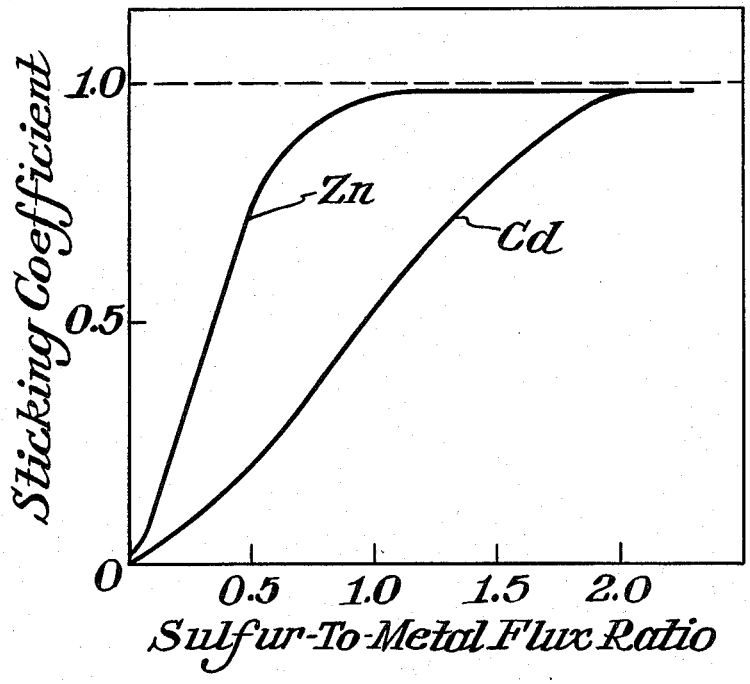

This sensitivity of properties to zinc content emphasizes the need for precise control of zinc and cadmium, which can be difficult to achieve, particularly in long commercial production runs. Laboratory experiments have shown that evaporation of all three elements of $Zn_xCd_{1-x}S$ at a rate corresponding to the stoichiometric ratio in the desired semiconductor does not consistently result in the desired composition. FIG. 2 illustrates a typical example of the dependence of the sticking coefficient of zinc as ZnS and cadmium as CdS on the ratio of sulfur to zinc and the ratio of sulfur to cadmium in formation and deposition of the respective sulfide by evaporation of the elements. Sticking coefficient, it is to be understood, means the fraction of an impinging element which combines and condenses to form a film of the compound in question. The experiments conducted to establish these curves were on fixed quartz substrates at temperatures in the range 150° to 300° C. in a vacuum bell-jar type enclosure with a heated evaporation source for each element controlled to within ±0.5° C. of the temperature determined to produce the desired rate of evaporation of the element.

In this figure it can be seen that the sticking coefficient of ZnS and CdS each increases as the sulfur content of the vapor increases. (The sticking coefficient, determined from the quantity of the compound in question deposited on a substrate in a time unit, is indicative of the extent to which elements react and the respective compounds are formed from the elements.) From these curves it can be seen that zinc is more reactive and the rate of formation of ZnS is greater than that of CdS. This agrees with results of concurrent evaporation of the metals in a system which is stoichiometrically deficient in sulfur wherein the formation of ZnS, is at the expense of CdS so that Cd is wastefully employed.

Accordingly, FIG. 2 reveals that due to the slope of the curves and their divergence, in preparation of $Zn_xCd_{1-x}S$ of a precise preselected Cd/Zn ratio by employing a vapor flux containing a sulfur/metal stoichiometric ratio corresponding to the desired compound, slight variations in the sulfur flux could result in significant changes in the compositions and properties of the photovoltaic material.

Referring again to FIG. 2, however, it is revealed that as the content of sulfur in the vapor increases, each of the curves is asymptotic to a line representing a sticking coefficient of approximately one. At a sulfur/metal ratio of about 2 (twice the stoichiometric requirement of sulfur) these curves coincide. Above a value of two on this asymptote of these curves (excess of sulfur in the vapor), there is an approximate equivalence of the sticking coefficient of CdS and ZnS.

Figure 3:
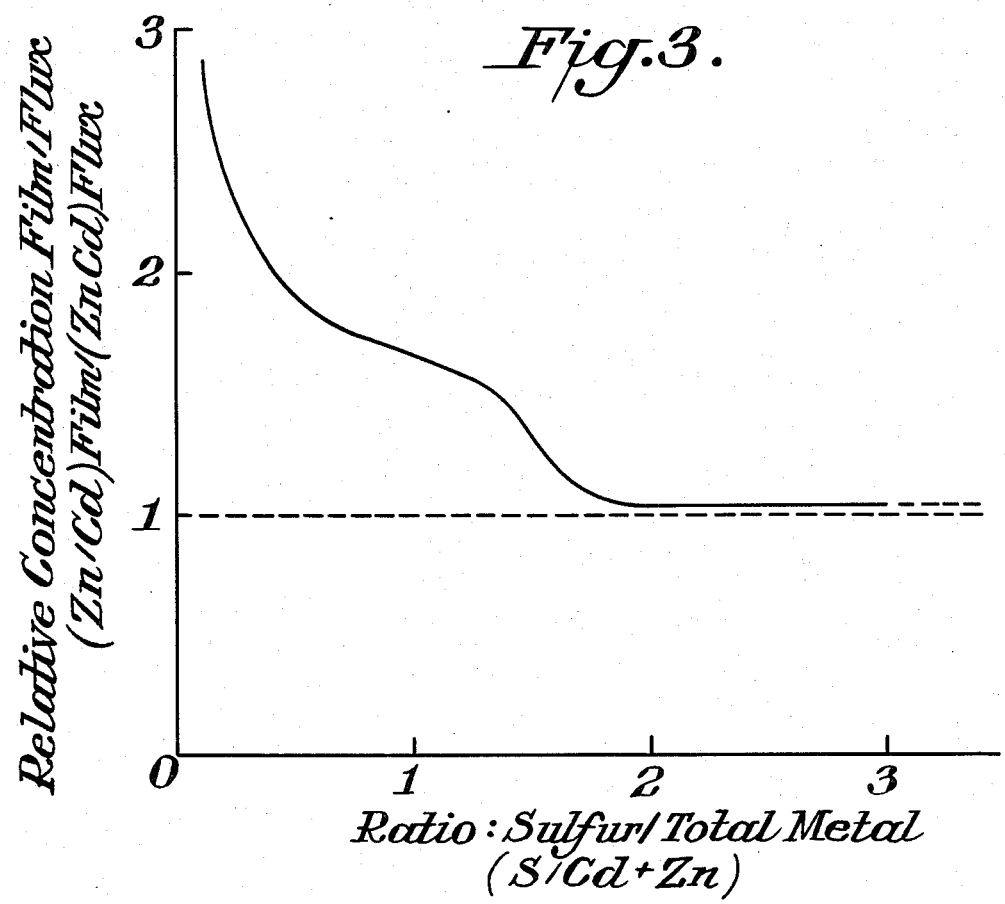
FIG. 3 shows how the sulfur vapor flux can affect the ratio of Cd/Zn in the compound formed.

Reference to FIG. 3 shows that the ratio of Zn/Cd of the deposited material to the ratio of these elements in the vapor, concurrently evaporated with sulfur vapor, at low sulfur content varies substantially but is constant as the sulfur vapor ratio reaches two or more. Here also is the area to operate where cadmium utilization is most efficent and control of the Cd/Zn ratio is facilitated.

The conclusion from these figures is that a preselected ratio of Zn and Cd in conformity with the requirements of FIG. 1 for control of band gap and uniformity could be maintained more readily and a process adapted to production for protracted periods with high utilization of costly cadmium (for industrial use) if twice the stoichiometric quantity of sulfur with respect to the intended compound based on the content of the other elements is present in the vapor. However, the presence of excess sulfur will lead to a low concentration of majority carriers, in the present case of $Zn_xCd_{1-x}S$, being electrons. In general, the majority carrier concentraton should be controlled within the range $10^{17}-10^{20}$ cm$^{-3}$ in order to assure efficient conversion of sunlight into electricity by the photovoltaic device comprising the ternary compound of Zn, Cd and S. In accord with one aspect of this invention, ternary semiconductor compound films having the desired composition and uniformity are obtained with the further desired carrier concentration by including in the vapor incident on the substrate a fourth vapor flux of a dopant species. In the embodiment of this invention that relates to ternary semiconductor compounds selected from groups II and VI of the periodic table dopants are selected from either groups III or VII of the periodic table. Such dopants are known in the art as donors or as n-type dopants.

A further requirement for efficient photovoltaic devices is the type of microstructure and crystallinity. In general, columnar grain structure is needed. Large grains, generally greater than one micron diameter and the absence of pinholes and microscopic inhomogeneities are desired. Maintenance of the substrate during the actual formation and deposition of the coating, at greater than 150° C. results in these desirable structural properties. The upper limit of the substrate temperature is that at which the rate of deposition is materially diminished, in part, by re-evaporation of the impinging elements or reversal of the formation reaction, as can be empirically determined by the operator. A satisfactory temperature range for the substrate is 150° to 300° C.

The Apparatus

Figure 4:
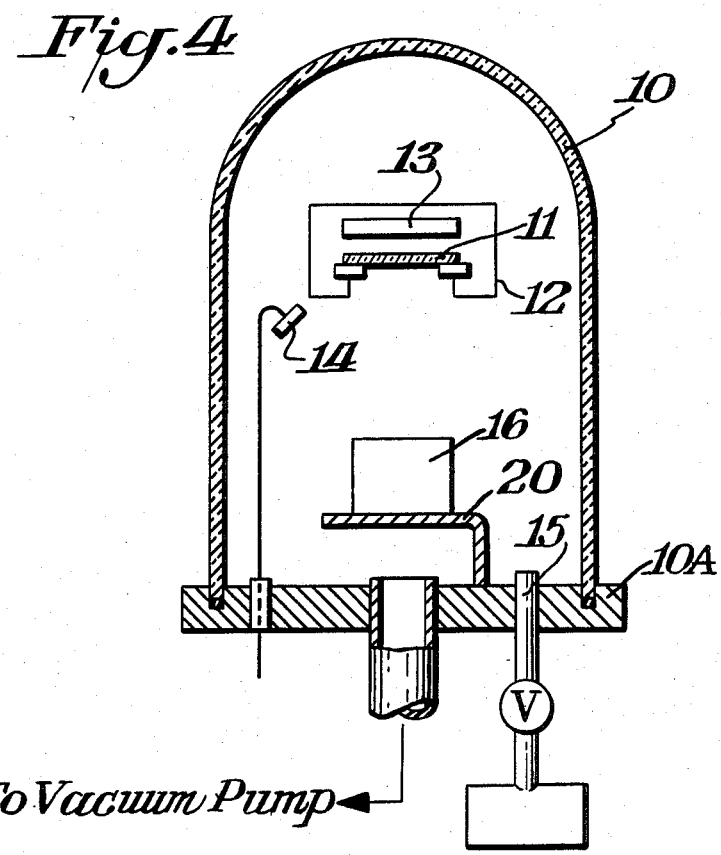
FIG. 4 is a depiction of apparatus for formation of $Zn_xCd_{1-x}S$ on a substrate.

Apparatus adapted to carrying out the foregoing novel process is illustrated in FIG. 4. This apparatus comprises a bell-jar type enclosure 10, on a base 10a through which is a port communicating with a vacuum pumping stack (not shown). Within enclosure 10 is substrate 11, supported by appropriate holders 12. Substrate heater 13 is positioned in an appropriate support box to radiantly heat substrate 11. Thickness monitor 14 is positioned near substrate 11 to receive a quantity of coating proportioned to that received by the substrate. Port 15 through the base provides for admission of gaseous dopants (I, Cl, etc.) if employed. Source 16 contains the components, Zn, Cd and S as well as any solid dopant, if employed. For clarity, provision for electric power, sensing devices, etc., have been omitted.

Figure 5:
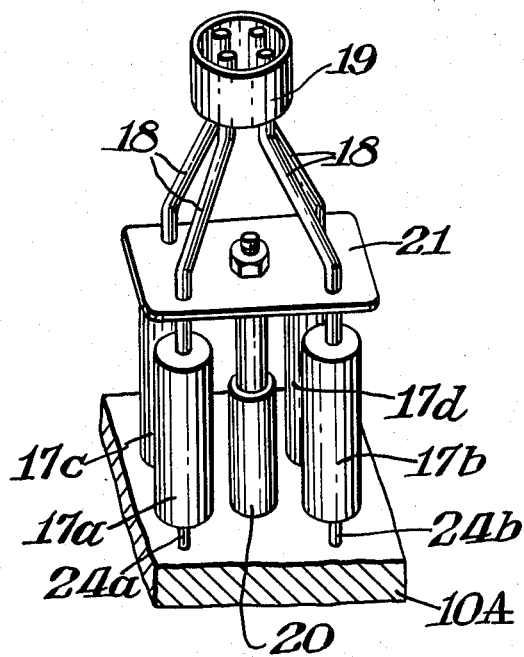
FIG. 5 is a drawing of the evaporator and conduit assembly.

An important feature of the coating apparatus is source 16 shown in more detail in FIG. 5. This component provides for concurrent evaporation of the several elements of the composition, at a closely controlled rate, conducting them separately to the zone of deposition where they converge, are mixed so that reaction occurs at the substrate surface with deposition of the desired semiconductor composition thereon. Source 16 has separate, substantially identical evaporation chambers or crucibles 17a, 17b and 17c for zinc, cadmium and sulfur, as well as one for any extrinsic dopant employed 17d. Each chamber is provided with conduit 18 to convey the evaporated elements to confluence chamber 19 where the vapors emerge and impinge on the heated substrate where they spread for reaction on the solid surface of the substrate. The source of which there may be several deployed across the base of the coater, is shown in FIG. 4 mounted on adjustable support 20 in ceramic base plate 21 of FIG. 5.

Figure 6:
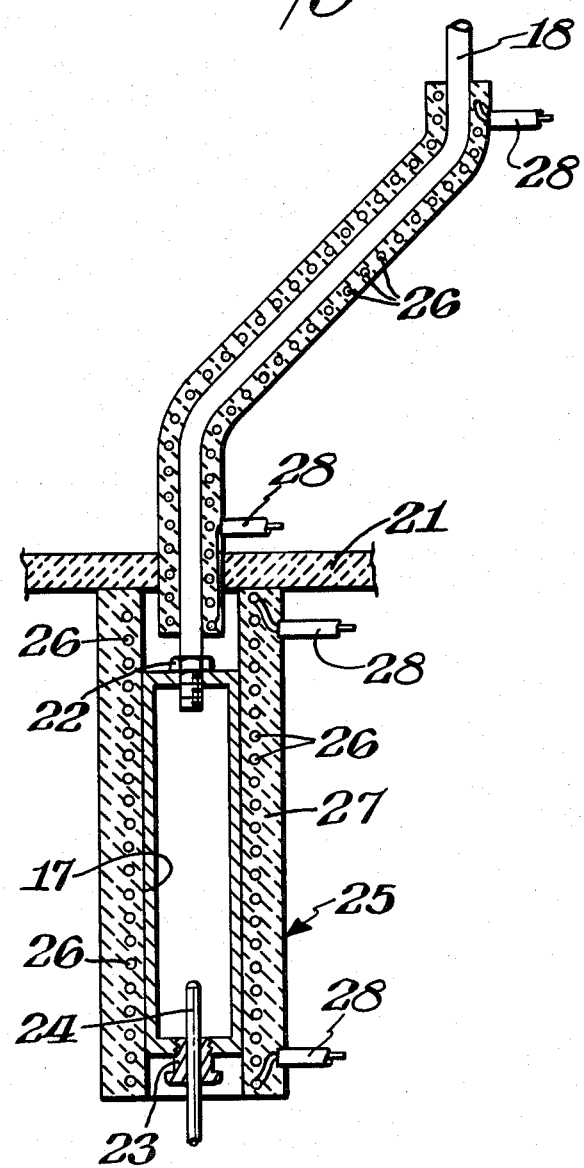
FIG. 6 is a more detailed drawing a single evaporator unit of the assembly.

FIG. 6 illustrates evaporation chamber 17 and conduit 18 in more detail. Chamber 17, a hollow cylinder is provided with threaded closures 22 and 23, which also serve as bushings for entry into the upper part of the tube of conduit 18 and into the lower part of the tube of temperature-sensing probe 24 which projects into the material to be evaporated. Chamber 17 is constructed of a corrosion and temperature resistant material such as graphite, boron nitride, fused silica or, preferably, stainless steel. Chamber 17 fits, for optimum thermal contact, snugly into heating jacket 25 which is provided with electric resistance heater windings 26. These windings are held in position by a ceramic coating 27 (Aremco Products, Ossining, N.Y. "Cerama Dip 538"). The heater windings 26 are coupled through terminals 28 to a controlled adjustable power source (not shown). In a similar manner, conduits 18 (preferably of 316 stainless steel or other appropriate temperature and corrosion resistant material) are provided with heater windings, which may be coupled to the same controlled power source as windings 26 or independently controlled heating system as dictated by evaporation conditions. Operation of this apparatus reveals that changes of 1° C. in the temperature of the melt chamber results in a change of 5% in the effusion rate of Zn and Cd. Accordingly, the evaporation chambers must be controlled to within 0.5° C. of the preselected temperature.

While the apparatus described is primarily exemplary for carrying out the basic process of the present invention, the process itself is especially adapted to apparatus for operation over protracted periods in forming a continuous thin-film photovoltaic coating on a continuous, laterally extended, flexible substrate. Such apparatus comprises a commercially available vacuum enclosure with supply and windup rolls for the flexible substrate, as is known in the art, and means to move it past the coating station. Such apparatus may comprise a plurality of sources as described. The process is especially useful in applying coatings of a uniform composition, little affected by variations in operating conditions which may cause variations in the flux of the independent element (sulfur, in this case) which normally would alter the ratio of the dependent elements (zinc and cadmium, in this case) in the product composition.

The emergent vapors impinge on the substrate and react to provide a coating, substantially uniform in composition and thickness from one edge to the other. Accordingly, depending upon the dimensions of the substrate being coated, several of the source assemblies may be required across the width of the substrate with additional rows deployed as determined from operating conditions, as may be determined by the skilled operator, generally as described in U.S. Pat. No. 4,325,986, "Method for Continuous Deposition by Vacuum Evaporation."

The process of the present invention may be employed in coating either by single batches or for continuous coating. For example, it may be used advantageously for coatings directly on conductors, semiconductors or as desired on insulating substrates. Such coatings are useful as photovoltaic elements or as components, such as window materials or other photovoltaic materials. Such coatings are further useful for optoelectronic devices such as photoreceptors and luminescent displays and for photosensitive elements such as are used in electrophotography.

PROCEDURE

Each element, Zn, Cd, S (and any extrinsic dopant such as In) is loaded into a separate chamber or source bottle, which is inserted into a heater and connected to a heated conduit leading to the confluence chamber adjacent to the substrate at the coating station. The coating chamber is sealed and pumped down to a pressure between $3 \times 10^{-6}$ and $5 \times 10^{-6}$ mm Hg. The source bottles are heated to temperatures selected to evaporate the elements at predetermined rates which produce the desired flux ratio. This is determined according to the teachings of FIGS. 2 and 3 in order to utilize the maximum amount of Cd and preferably produce simultaneously a compound whose ratio of Zn to Cd is essentially the same as the ratio of these metals in the flux. This flux of elements is directed onto the substrate which is heated to a predetermined temperature between 150° C. and 300° C. The substrate may be fixed in position adjacent the coating station or conveyed past the coating station at a controlled fixed rate. The total mass flux and distance between the confluence chamber and substrate are preselected to deposit a coating which is essentially uniform in composition and thickness to a predetermined growth rate, typically 1 $\mu$m/min.

The electrical resistivity of the film is typically between $1 \times 10^{-2}$ and 100 ohm-cm and is controlled by including in the flux an extrinsic dopant such as indium (In) or chlorine (Cl$_2$). This coated substrate is suitable for use in constructing photovoltaic cells of the conventional type, for instance $Zn_xCd_{1-x}S/Cu_2S$, $Zn_xCd_{1-x}S/CdTe$, and $Zn_xCd_{1-x}S/CuInSe_2$ by techniques described, for instance, in commonly assiged U.S. Pat. Nos. 4,239,553 and 4,267,398.

As indicated hereinbefore, the utility of the $Zn_xCd_{1-x}S$ compound in photovoltaic conversion resides in the ability to engineer certain of its properties in such a way as to optimize photovoltaic conversion efficiency. Specifically, these properties include optical bandgap, electron affinity and lattice constant. In order to engineer into the $Zn_xCd_{1-x}S$ the appropriate electrical resistivity for photovoltaic operation ($10^{-2} < \rho < 10^2$ $\Omega$cm), the introduction by coevaporation of a fourth element. a doping element (e.g. Al, Ga, In, Cl, Br, I) is utilized; typically the amount of dopant required in the $Zn_xCd_{1-x}S$ is in the range of 0.001% to 1%.

While the invention is described with respect to its utility with the photovoltaic composition $Zn_xCd_{1-x}S$, it is to be understood it is also applicable to other ternary compositions known to those skilled in the art. The essential, underlying feature is to operate with an elemental content in the flux of one element (sulfur in this case) in a regime where slight changes in that elemental content will have no effect on the composition of the ternary compound formed between it and the two other elements (zinc and cadmium in this case). A sulfur flux in excess of the combined cadmium and zinc fluxes to a value of at least two is required in this exemplary case. Data such as that illustrated in FIG. 2 and FIG. 3 are useful guides.

We claim:

1. In a process for forming a semiconductor material of a preselected composition comprising three elements, said three elements capable of having a first element from group II in a variable proportion to a second element from group II and a third element from group VI in a proportion equal to the sum of the first element and the second element, said composition formed by heating to evaporate said elements to form a vapor flux of each element in a vacuum, conducting the vapor flux of each of the said three to a heated substrate to combine and form the semiconductor material thereon, the improvement comprising:
   controlling the flux of the first element and the second element at a value corresponding to the proportion of the respective elements in the preselected composition; and
   controlling the flux of the third element to at least twice the sum of the fluxes of the first and the second elements whereby to produce the composition with the preselected proportion of the first to the second element and the proportion of the third element equal to the sum of the first and second elements.

2. The process in claim 1 wherein the flux of the elements is controlled by independently controlling the temperature at which the elements are evaporated.

3. In a process as in claim 1 wherein the elements are selected from the elements of group II and group VI of the periodic table comprising zinc, cadmium and sulfur.

4. A vacuum process for formation from the elements of and depositing on a substrate a compound of zinc, cadmium and sulfur of the empirical formula $Zn_xCd_{1-x}S$, where x is a positive number less than 1, the compound having a selected substantially fixed atomic ratio of cadmium to zinc, the the process comprising heating the elements in separate vessels to a temperature to emit vapor at a controlled rate, the rate of emission of zinc vapor and cadmium vapor controlled to be proportioned to the selected ratio of the elements in the selected compound and the rate of emission of sulfur vapor is at least twice the sum of the rate of zinc and cadmium and conducting the vapor of the element to the substrate where they are allowed to react to form the compound.

5. The process of claim 3 wherein the value of x is 0.4 or less.

6. In a process for continuously forming from its elements and depositing a coating of a semiconductor compound of cadmium, zinc and sulfur of a preselected composition on a surface of a moving substrate, said process including moving the substrate from substrate supply means, through a coating station to take-up means wherein the substrate at the coating station is heated to a preselected temperature, allowing said elements in the vapor state to impinge on the heated surface of the moving substrate to chemically react and form said coating on the surface of the substrate, the improvement comprising:
   vaporization of each of said elements in a separate evaporator means;
   independently controlling the rate of vaporization of each of said elements by independently controlling the temperature of each evaporator means;
   separately conducting the vapor of each element to the coating station through separate heated conduit means;
   allowing the vapor of each element to emerge from said conduit to impinge on the heated surface of said moving substrate;
   controlling the atomic ratio of cadmium to zinc in the vapor impinging on the substrate to a value proportional to the atomic ratio of cadmium and zinc in the preselected compound and controlling the atomic content of sulfur in the vapor impinging on the substrate to a value equal to at least twice the atomic content of cadmium and zinc in the vapor.

7. In a process claimed in claim 4 wherein a dopant selected from the group consisting of aluminum, gallium, indium, chlorine, bromine and iodine is introduced as a vapor flux to provide a concentration of the selected element of 0.001% to 1% in the photovoltaic composition.

* * * * *